(12) United States Patent
Robertson et al.

(10) Patent No.: US 10,855,258 B1
(45) Date of Patent: Dec. 1, 2020

(54) VOLTAGE CONTROL

(71) Applicant: Cirrus Logic International Semiconductor Ltd., Edinburgh (GB)

(72) Inventors: Gary Robertson, Edinburgh (GB); Hamed Sadati, Edinburgh (GB); Rupesh Khare, Edinburgh (GB); Sameer Baveja, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/594,794

(22) Filed: Oct. 7, 2019

Related U.S. Application Data

(60) Provisional application No. 62/887,989, filed on Aug. 16, 2019.

(51) Int. Cl.
*H03K 3/012* (2006.01)
*H04R 3/00* (2006.01)
*H03K 5/08* (2006.01)

(52) U.S. Cl.
CPC ............... *H03K 3/012* (2013.01); *H03K 5/08* (2013.01); *H04R 3/00* (2013.01)

(58) Field of Classification Search
CPC .. H04R 3/00; H04R 2420/01; H04R 2499/11; H04R 19/005; H04R 1/1041; H04R 2460/03; H04R 3/06; H04R 19/00; H04R 19/04; H04R 2430/01; H04R 3/005; H04R 29/001; H04R 3/007; H04R 5/04; H03G 3/30; H03G 3/341; H03G 3/348; H03G 1/0088; H03G 3/00; H03G 3/3005;
(Continued)

(56) References Cited

U.S. PATENT DOCUMENTS 9,294,598 B2 * 3/2016 Yamada ............ H03K 17/6874
10,097,178 B1 * 10/2018 Ou ..................... H03K 17/0822
(Continued)

FOREIGN PATENT DOCUMENTS

EP 2448120 A1 5/2012
GB 2547730 B2 7/2016

OTHER PUBLICATIONS

Combined Search and Examination Report under Sections 17 and 18(3), UKIPO, Application No. GB19007631, dated Jul. 4, 2019.

*Primary Examiner* — Lun-See Lao
(74) *Attorney, Agent, or Firm* — Jackson Walker L.L.P.

(57) ABSTRACT

This application relates to methods and apparatus for voltage control, and in particular to maintain safe voltages for components of audio driving circuits that are operable in a high voltage mode. An audio driving circuit (100) may include a power supply module (106) and may be operable such that, in use, a voltage magnitude at a source terminal of at least a first transistor (306, 309, 603, 605) of the audio driving circuit can exceed its gate-source voltage tolerance. A voltage generator (111P) is configured to output a first intermediate voltage ($V_{SAFEP}$) to an intermediate voltage path for use as a gate control voltage for at least the first transistor, to maintain its gate-source voltage below tolerance. An intermediate path voltage clamp (114P) is provided for selectively clamping the intermediate voltage path to a voltage level, so as to maintain the magnitude of the gate-source voltage of the first transistor below tolerance. The voltage clamp (114P) is enabled by a reset condition (RST) for the audio driving circuit.

18 Claims, 4 Drawing Sheets

(58) Field of Classification Search
CPC .......... H03G 3/32; H03G 3/345; H03G 7/002; H03G 7/06; H04N 9/72; H04N 11/00; H04N 5/185; H04N 5/63; H04N 9/66; H04N 9/70; H04S 1/007; H04S 2400/13; G10H 1/0091; G10H 1/043; G10H 1/057; G10H 1/12; G10H 2210/211; G10H 2210/215; G10H 2210/251; G10H 5/06; G10H 7/00; G10L 19/02; G10L 25/00; H04M 11/007; H04M 11/045; H04M 11/06; H04M 19/08; H04M 1/0274; H04M 1/50; H04M 1/6025; H04M 1/725; H04M 9/08; H04Q 11/04; H04Q 11/0428; H04Q 1/45; H04Q 3/00; H04W 52/0029; H04W 52/0283; H04W 88/021; H04W 88/022; H03F 1/0211; H03F 1/0222; H03F 1/305; H03F 1/3217; H03F 1/34; H03F 1/52; H03F 2200/504; H03F 2200/511; H03F 2200/537; H03F 2203/21157; H03F 2203/21169; H03F 2203/45704; H03F 2203/45712; H03F 2203/45731; H03F 3/181; H03F 3/183; H03F 3/30; H03F 1/0216; H03F 1/565; H03F 2200/222; H03F 2200/387; H03F 2200/451; H03F 3/185; H03F 3/19; H03F 3/1935; H03F 3/3091
USPC .............................................. 381/56–58, 123
See application file for complete search history.

(56) References Cited

U.S. PATENT DOCUMENTS

| | | | |
|---|---|---|---|
| 10,171,072 B2* | 1/2019 | Ko | H03K 17/6874 |
| 2008/0116751 A1 | 5/2008 | Kihara et al. | |
| 2012/0056660 A1* | 3/2012 | Yamada | H03K 17/6874 327/434 |
| 2016/0191036 A1 | 6/2016 | Ko et al. | |
| 2017/0104481 A1 | 4/2017 | Ko et al. | |
| 2017/0251294 A1* | 8/2017 | Khare | H03G 3/348 |
| 2020/0186918 A1* | 6/2020 | Khare | H04R 5/04 |

* cited by examiner

VOLTAGE CONTROL

The present disclosure claims priority to U.S. Provisional Patent Application Ser. No. 62/887,989, filed Aug. 16, 2019, which is incorporated by reference herein in its entirety.

The field of representative embodiments of this disclosure relates to methods, apparatus and/or implementations concerning or relating to controlling voltage and, in particular, to controlling voltages for audio driving circuitry to avoid a risk of voltage stress.

Many electronic devices have the ability to provide audio driving signals to audio output transducers, e.g. loudspeakers. In some cases the electronic device may be capable of providing audio driving signals to an accessory or peripheral apparatus, for example a set of headphones or earbuds or the like, that may, in use, be removably connected to the electronic device via some wired connection. For example many electronic devices may have a receptacle or socket, such as a 3.5 mm jack-socket for example, for receiving a corresponding mating plug of an accessory apparatus. Audio driving circuitry, for example an audio codec, of the electronic device may be operable to provide analogue audio driving signals to drive loudspeakers of the accessory apparatus when connected.

There is a wide variety of different audio accessory apparatus that may, in use, be connected to such an electronic device and at least some audio accessory apparatus may represent a relatively high impedance load. For example, some headphone accessories may have a load impedance, for DC, of the order of several hundred ohms.

To drive audio accessories that present a relatively high impedance load, it may be desirable for the audio driving circuitry to be able to generate relatively high power, large amplitude driving signals. In particular, it may be desirable to generate driving signals of a greater amplitude than would conventionally be the case for such audio driving circuitry, e.g. codecs or headphone amplifier circuits or the like. Such large amplitude driving signals can, however, result in greater than usual voltage stresses across components of the audio driving circuitry.

Embodiments of the present disclosure relate to methods, apparatus and systems for voltage control and in particular to the generation and maintenance of suitable control voltages for audio driving circuitry.

According to an aspect of the disclosure there is provided an audio driving circuit comprising a first transistor having a gate-source voltage tolerance and a power supply module configured to generate at least a first supply voltage for the audio driving circuit, wherein the audio driving circuit is operable in a first mode in which the first supply voltage has a first magnitude such that, in use, a voltage magnitude at a source terminal of the first transistor can exceed the gate-source voltage tolerance of the first transistor. A voltage generator is configured to, in the first mode, output a first intermediate voltage to an intermediate voltage path for use as a gate control voltage for at least the first transistor, the first intermediate voltage having a magnitude lower than said first magnitude so as to maintain the magnitude of the gate-source voltage of the first transistor below said tolerance when applied to the gate of the first transistor. The audio driving circuit also comprises an intermediate path voltage clamp for selectively voltage clamping the intermediate voltage path to a voltage level so as to maintain the magnitude of the gate-source voltage of the first transistor below said tolerance, wherein said voltage clamp is enabled by a reset condition for the audio driving circuit.

The reset condition may comprise initiation of a hardware reset, during which one or more externally generated clocks for digital control of the audio driving circuit are not available.

The audio driving circuit may also comprise clamp enable circuitry configured to enable operation of the first intermediate path voltage clamp in response to said reset condition. The clamp enable circuitry may be configured to receive a power supply, which is different to the input voltage for the power supply module, and which remains available during a reset initiated by said reset condition. In some examples the clamp enable circuitry may be configured to receive a battery voltage from a battery of a host device as the power supply. The clamp enable circuitry may comprise a voltage regulator configured to regulate said battery voltage. In some examples the clamp enable circuitry may comprise a reset module configured to monitor for the reset condition and, in response to detecting the reset condition, to generate a reset control signal to enable the intermediate path voltage clamp.

In some examples the intermediate path voltage clamp may comprise a series connection of a plurality of diodes and a clamp enable transistor configured in series between a node that receives the first supply voltage and a node of the intermediate voltage path. The clamp enable circuitry may comprise a voltage selector configured to receive the reset control signal, the first supply voltage and the first intermediate voltage and, based on the reset control signal, to selectively output an output voltage based on either the first supply voltage or the first intermediate voltage as a gate control signal for the clamp enable transistor of the intermediate path voltage clamp.

In some implementation the audio driving circuit may comprise at least a first voltage selector which is configured to receive the first intermediate voltage and to selectively output the intermediate voltage as a gate control voltage for at least one transistor based on a received transistor control signal for the relevant transistor. The first voltage selector may be configured to receive the transistor control signal, the first supply voltage and the first intermediate voltage and, based on the transistor control signal, to selectively output an output voltage based on either the first supply voltage or the first intermediate voltage as the gate control voltage. In some examples the first transistor may form part of the first voltage selector. In some examples the first voltage selector may output a gate control voltage to at least one of: a transistor of an output stage of an output driver of the audio driving circuit; and a transistor of an audio output path clamp switch.

The first transistor may be implemented as one of a laterally diffused MOS transistor device or an extended drain MOS transistor device.

In some examples the power supply module may be operable, in the first mode, to further generate a second supply voltage of opposite polarity but equal magnitude to the first supply voltage. In which case, the audio driving circuit may further comprise a second voltage generator configured to, in the first mode, output a second intermediate voltage to a second intermediate voltage path for use as a gate control voltage for at least a second transistor, the second intermediate voltage having a magnitude lower than said first magnitude so as to maintain the magnitude of the gate-source voltage of the second transistor below a gate-source voltage tolerance of the second transistor when applied to the gate of the second transistor. There may also be an intermediate path voltage clamp for selectively clamping the second intermediate voltage path to a defined voltage so as to maintain the magnitude of the gate-source voltage of the second transistor below said tolerance. The voltage clamp for the second intermediate voltage path may also enabled by a reset condition for the audio driving circuit.

In some examples the power supply module may be further operable in a second mode in which the first supply voltage has a second magnitude, lower than the first magnitude. In normal operation in the second mode, a voltage magnitude at a source terminal of the first transistor may not exceed the gate-source voltage tolerance of the first transistor. The voltage generator may be disabled in the second mode.

The audio driving circuit may be implemented as an integrated circuit. The audio driving circuit may form at least part of an audio codec.

Embodiments also relate to an electronic device comprising an audio driving circuit as described in any of the variants herein. The electronics device may include a connector for making a removable mating connection with an accessory apparatus in use, and the audio driving circuit may be configured to output at least one audio driving signal to an electrical contact of the connector. The electronic device may be at least one of: a portable device, a battery powered device, a communication device; a mobile or cellular telephone device or a smartphone; a computing device; a tablet, notebook, laptop or desktop computer; a wearable device; a smartwatch; a voice activated or voice controlled device.

In another aspect there is provided an audio driving circuit comprising a plurality of transistors and a power supply module operable in a first mode to generate at least a first voltage having a first voltage magnitude, wherein the first voltage magnitude is such that, in use in the first mode, for a first set of one or more transistors, a source terminal of the transistor of the first set can exceed the gate-source voltage tolerance of that transistor. An intermediate voltage generator is configured to, in the first mode, output a first intermediate voltage to an intermediate voltage path to provide a voltage that can be used as a gate control voltage for the one or more transistors of the first set, wherein the first intermediate voltage differs from the first voltage by an amount which is less than the gate-source voltage tolerance of a transistor of the first set. An intermediate path voltage clamp is provided for selectively voltage clamping the intermediate voltage path in response to a reset condition for the audio driving circuit.

In another aspect there is provided an audio driver circuit comprising at least a first transistor having a gate-source voltage tolerance and a power supply having a power supply controller operable to control the power supply in a first mode to generate a supply voltage with a magnitude greater than said gate-source voltage tolerance. A voltage controller is configured to generate a first control voltage for use as a gate control voltage for at least the first transistor to maintain the magnitude of the gate-source voltage of the first transistor below said tolerance and a voltage clamp is configured to clamp the output of the voltage controller to said first control voltage in the event that the power supply controller is inoperable.

In another aspect there is provided an integrated circuit comprising a voltage generator for generating a first controlled voltage for use as safe gate control voltage for at least one transistor and a voltage clamp for clamping the output of the voltage controller to said first control voltage, wherein the voltage clamp is enabled and disabled by a reset signal for the integrated circuit.

Unless expressly indicated to the contrary, any of the various features of the various implementations discussed herein may be implemented together with any one or more of the other described features in any and all suitable combinations.

For a better understanding of examples of the present disclosure, and to show more clearly how the examples may be carried into effect, reference will now be made, by way of example only, to the following drawings in which.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As discussed above, a host device may include audio driver circuitry, such as an audio codec or the like, for outputting an audio driving signal to an audio transducer. The audio driver circuit may be capable of outputting an audio drive signal to a transducer, e.g. a loudspeaker, that is part of the host device together with the audio driver circuitry. Additionally or alternatively, the audio driver circuit may be capable of an outputting audio drive signal to an accessory apparatus that, in use, is removably connected to the host device, and the audio driver circuitry may thus comprise a headphone amplifier circuit, for instance as at least part of an audio codec.

Figure 1:
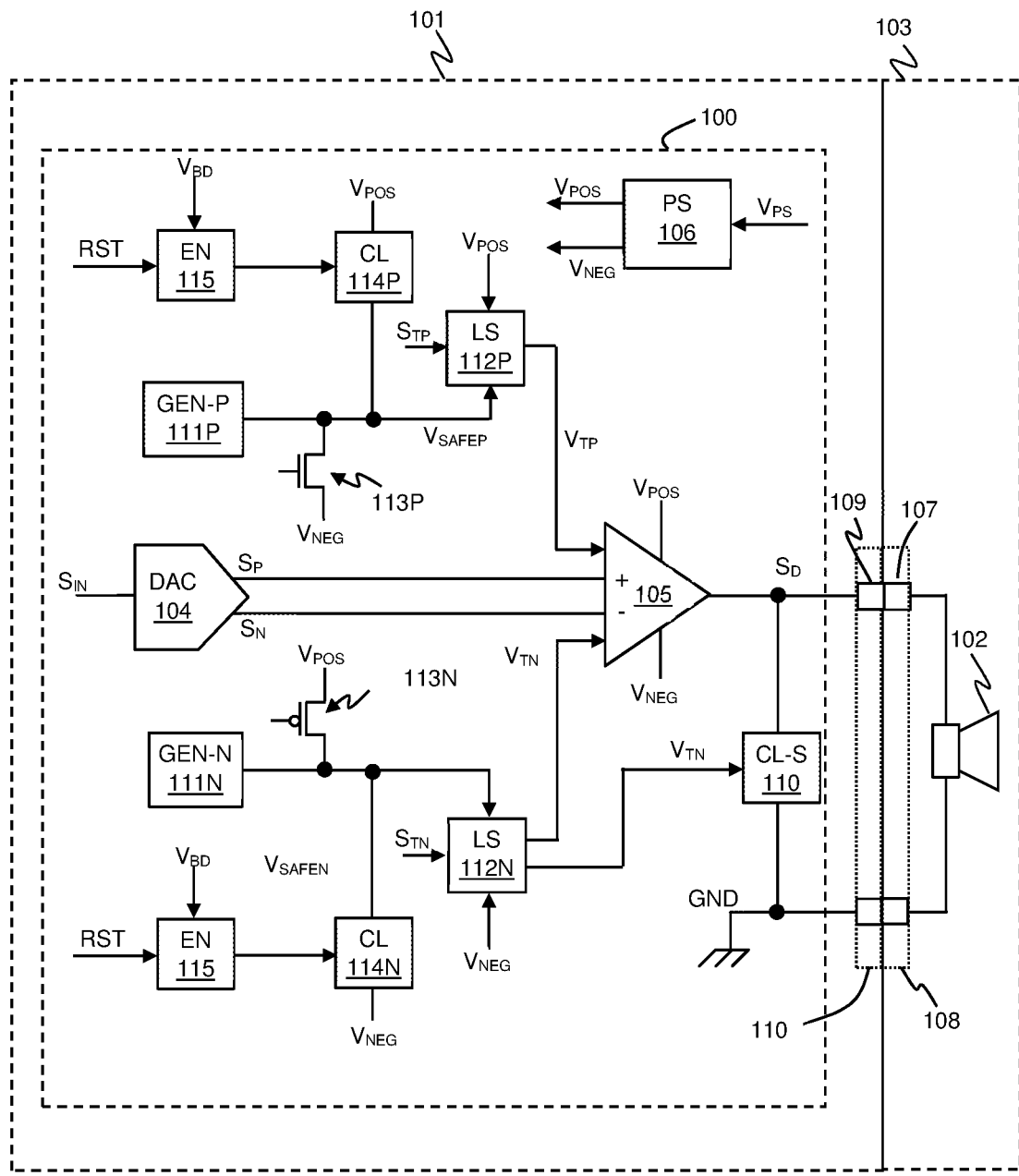
FIG. 1 illustrates one example of audio driving circuitry according to an embodiment.

FIG. 1 illustrates one simplified example of an audio driving circuit 100 according to an embodiment. FIG. 1 illustrates that the audio driving circuit 100 may be part of a host device 101 and arranged to output, in use, an audio driving signal $S_D$ to drive an audio load 102, e.g. loudspeaker. In the example of FIG. 1, the audio load 102 is a loudspeaker of an accessory apparatus 103 that may be removably connected to the host device 101, but in other examples the audio load could be part of the host device 101. Note that FIG. 1 shows just one audio output for simplicity but in practice there may be additional audio signals paths, for instance Left and Right audio channels for driving stereo audio output signals to Left and Right loudspeakers of a connected accessory apparatus.

In the example of FIG. 1, the audio signal path includes a DAC (digital-to-analogue converter) 104 and an output driver 105, such as a suitable amplifier. In this example the DAC 104 receives an input signal $S_{IN}$ and generates a differential output signal, and thus generates first and second analogue signals $S_P$ and $S_N$ as part of a differential pair. The output driver 105, in this example, is thus a differential-input amplifier that generates the driving signal $S_D$. A power supply module 106, receives an input power supply voltage $V_{PS}$ and generates at least one supply voltage for supplying components of the audio output path. In this example the power supply module 106 generates bipolar supply voltages $V_{POS}$ and $V_{NEG}$, which supply the output driver 105. The power supply module 106 may, in some examples, be a suitable DC-DC converter, for example a charge pump, that receives an input power supply voltage $V_{PS}$ and which generates the bipolar supply voltages $V_{POS}$ and $V_{NEG}$.

The output driver 105 generates the output driving signal $S_D$ to vary positively and negatively with respect to a defined reference voltage, in this example ground (GND). It will be noted that whilst FIG. 1 shows a differential-output DAC 104 and differential-input amplifier 105, it will be understood that single-ended audio signal paths may be implemented in some audio driving circuits.

The driving signal $S_D$ generated by the output driver 105 is output, in this example, to drive a loudspeaker 102 of accessory apparatus 103, e.g. a headphone or an earbud speaker or the like. In use, the accessory apparatus 103 may be removably connected to the host device via suitable connectors, such as a jack plug of the accessory apparatus and a jack socket of the host device, but any suitable plug and receptacle connectors may be used. In use, contacts 107 of the audio accessory apparatus 103, for example poles of a jack plug (generically indicated by dotted box 108) will be coupled, directly or indirectly, to respective contacts 109 of the host device 101, for example poles of a jack socket (generically indicated by dotted box 110). The loudspeaker 102 of the audio accessory apparatus 103 may also have a return path to a defined reference voltage, in this example to ground, via one contact/pole 107 of the connector 108 of the accessory apparatus.

FIG. 1 also illustrates that there may be an audio output path clamp 110 for clamping the output of the amplifier 105 to the reference voltage, in this example ground (GND), when outputting of the audio driving signal $S_D$ is not required. The audio output path clamp 110 may be disabled when the audio driving circuit 100 is operating to provide a driving signal, but may be enabled when required to clamp, i.e. hold, the output path at ground. The audio output path clamp 110 may comprise a switch arrangement for selectively coupling the audio output path to the reference voltage, in this example ground.

It will be appreciated that various components of the audio driving circuit 100 will typically comprise semiconductor devices, in particular transistors. The output driver 105 will typically comprise multiple transistors. Likewise, the audio output path clamp 110 may typically be implemented by one or more transistors. One skilled in the art will readily understand that semiconductor devices such as transistors will generally have a certain voltage rating, i.e. a voltage tolerance for voltages across the device. The voltage tolerance is an indication of the maximum voltage that can be tolerated, possibly across specific terminals of the device, in a safe and sustained manner. The device may be able to withstand voltage stresses greater than the specified tolerance for short periods of time, but a relatively prolonged period of voltage stress above given tolerances can shorten the operating lifetime of the device and voltage stress significantly above given tolerances can lead to damage and/or failure of the devices. For instance a voltage stress above a gate-source breakdown voltage of a transistor device may result in damage.

Conventionally, for the power supply and output signal levels typically used in headphone driver circuits and the like, transistors with suitable voltage ratings may be readily fabricated using standard semiconductor processing suitable for mass manufacture. Purely by way of example, a conventional single channel, i.e. Left or Right, headphone driving circuit may typically have been implemented to operate with driving signals $S_D$ at a level of about one volt rms (1 Vrms) or so, and thus a peak-to-peak voltage range of the order two (2) to three (3) volts or so, for example a voltage range of +1.5V to −1.5V. Transistors able to cope with such voltage stress, say of the order of 3.5V, may be readily implemented and mass produced, at least for some common semiconductor process node geometries.

It may, in some instances, be desirable to be able to output larger amplitude driving signals, in at least one mode of operation, for example to provide good user experience when driving audio accessories such as headphones that present a relatively high impedance load, say of the order of several hundred ohms. Again, purely by way of example, it may, in some instances, be desirable to output a driving signal $S_D$ of the order of a few volts rms, which may involve peak-to-peak voltage swings of the order of nearly ten volts or so, e.g. a swing from say +5V to −5V. Thus, the magnitude of power supply voltages $V_{POS}$ and $V_{NEG}$ could, in at least one mode of operation, be of the order of 5.5V or so. Such voltage magnitudes and peak-to-peak voltage swings will generally be greater than the voltage tolerance of conventional semiconductors as used for audio driving circuitry.

It has been proposed that some MOSFET type transistors could be implemented as Laterally Diffused MOS devices (LDMOS) or Extended Drain MOS devices (EDMOS). LDMOS and EDMOS are known designs, that have been used in the field of power amplifiers for RF communications. Such devices are designed to be able to withstand drain-source voltages that may be greater than other standard designs. For instance, LDMOS devices with a voltage rating of 5V or 12V (for the drain-source voltage) can be produced using conventional semiconductor fabrication processes, and thus could be implemented within an otherwise conventional headphone driver circuit.

Thus, an LDMOS or EDMOS or similar enhanced tolerance transistor could advantageously be implemented to allow such high power operation of the audio driving circuit as discussed above. Depending on the expected voltage stress across the transistor in its off state, the transistor could be implemented as, for example, a 5V device or a 12V device as appropriate.

However, whilst implementing a transistor as an LDMOS or EDMOS may improve the voltage handling capability of the drain, e.g. from say about 3.5V of a standard design to 5V or 12V, the gate oxide of the device may effectively be the same as a standard device, and thus there is still a limit to the voltage tolerance of the gate, and in particular a limit to the maximum gate-source voltage that can safely be tolerated. Thus, whilst the drain-source voltage tolerance of an LDMOS or EDMOS may be 5V or 12V for example, the gate-source voltage tolerance may still be of the order of 3.5V.

Embodiments of the present disclosure relate to audio driving circuits that advantageously are operable in a relatively high-power mode of operation, for instance to generate driving signals such as discussed above. In such implementations, a power supply of the audio circuit may be operable, in at least one mode of operation—that will be referred to herein as a high-voltage mode of operation—to generate a relatively high supply voltage, for instance at least one supply voltage with a magnitude such that a voltage magnitude at a terminal of a first transistor can exceed a voltage tolerance of that first transistor. In particular, a high-voltage mode of operation may be one in which a voltage at a source terminal of a first transistor may experience a voltage magnitude which is greater than the gate-source voltage tolerance of the first transistor and which may be greater than a gate-source breakdown voltage. In a high-voltage mode of operation, the magnitude of a supply voltage may be greater than a gate-source voltage tolerance of the first transistor. In such a high-voltage mode of operation, the audio driving circuit controls the gate voltage of the first transistor so as to remain within the gate-source voltage tolerance, i.e. below a gate-source breakdown voltage. In particular the audio driving circuit generates at least one intermediate voltage that can be used as a gate control voltage for the first transistor.

The first transistor may be a transistor of the audio driving circuit which is arranged such that, in use in a high-voltage mode of operation, the source of the first transistor may experience a voltage which is effectively at or near a relevant supply voltage, i.e. the source voltage may be at or near the positive supply voltage $V_{POS}$ for p-channel device such as a PMOS or at the negative supply voltage $V_{NEG}$ for an n-channel device such as an NMOS.

The audio driving circuit is configured to generate at least one intermediate voltage, which may be used as a gate control voltage for at least the first transistor. The intermediate voltage may be generated to be the same polarity as the relevant supply voltage, but to be lower in magnitude. The intermediate voltage is thus an intermediate voltage, that is between the reference voltage, e.g. ground, and the relevant supply voltage, and thus is non-zero (with respect to the reference voltage). The intermediate voltage may, in particular, be generated so as to differ from the relevant supply voltage by an amount which is greater than the voltage threshold for controlling conduction through the first transistor, but which is less than the gate-source voltage tolerance of the first transistor. The intermediate voltage can thus be identified as a safe voltage level that can safely be supplied to the gate of the first transistor, and which will keep the gate-source voltage within tolerance, even if the source of the first transistor were at the relevant supply voltage.

Purely as examples, in some implementations the power supply module may be operable in a high-voltage mode to generate at least one supply voltage having a nominal magnitude or 4V or greater, or 4.5V or greater or 5V or greater. The power supply module may generate bipolar voltages of these magnitudes. The magnitude of the supply voltage may be greater than a voltage tolerance of the first transistor, in particular a gate-source voltage tolerance. In some implementations, the gate-source voltage tolerance of the first transistor may be less than 4V. In some examples the gate-source voltage tolerance or rating of the first transistor may be 3V or greater, or 3.5V or greater. The intermediate voltage may be generated to be lower in magnitude than the relevant supply voltage by at least 2V or greater, or at least 2.5V or at least 3V, but not to differ by more than the gate-source tolerance.

The safe intermediate voltage can be selectively used to provide suitable control voltages for one or more transistors of the audio driving circuit, e.g. for a set of one or more transistors that may, in the high voltage mode of operation, be subject to relatively high voltages at one terminal. For instance, consider that a transistor has its source coupled to a relevant supply voltage, e.g. a PMOS has its source coupled to the positive supply voltage $V_{POS}$, and thus the source remains at this voltage whether the transistor is conductive or not. In this case, if the gate voltage were controlled to be substantially equal to the relevant supply voltage, there would be effectively no gate-source voltage and the transistor would be off. If the gate voltage were driven to the intermediate voltage level, the gate source voltage would be sufficient to turn the transistor on, but the gate source voltage would remain within tolerance.

The audio driving circuit 100 thus includes at least one voltage generator for outputting a suitable intermediate voltage to an intermediate voltage path. FIG. 1 illustrates that, in this example, there may be respective positive and negative voltage generators 111P and 111N (which may be collectively or individually identified by the reference 111) operable, when the power supply module 106 is in a high-voltage mode of operation, to generate respective positive and negative intermediate voltages $V_{SAFEP}$ and $V_{SAFEN}$.

Figure 2:
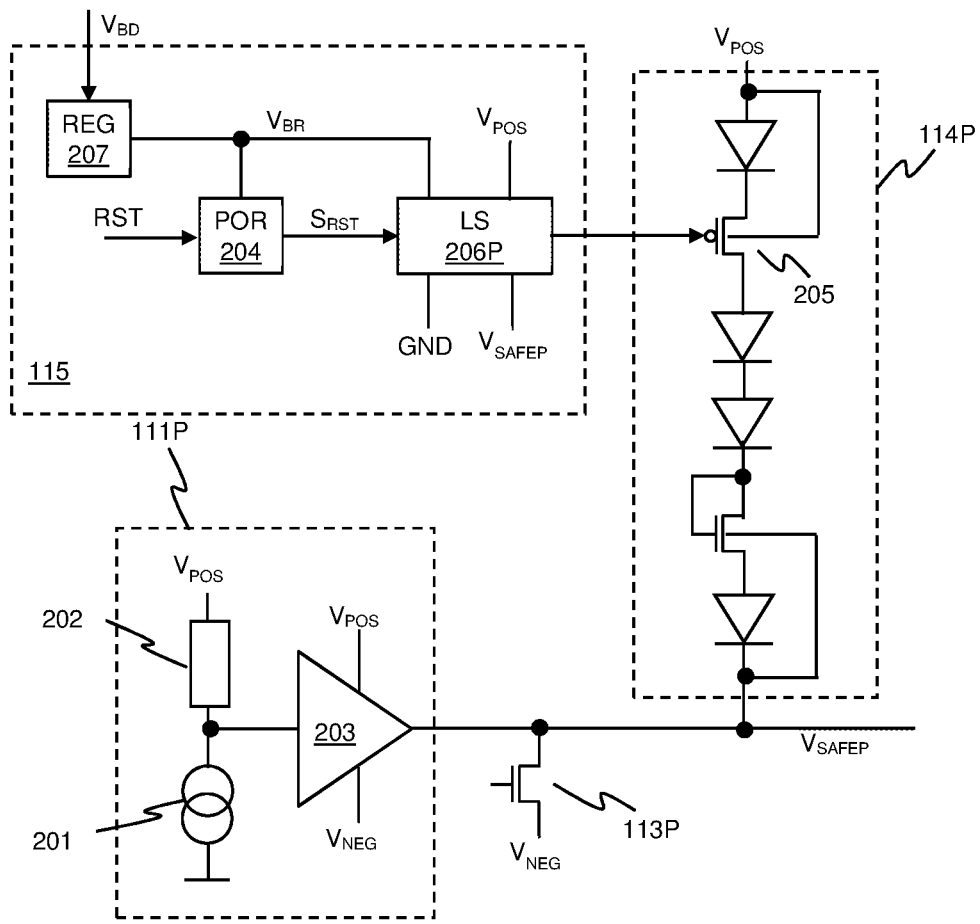
FIG. 2 illustrates an example of an intermediate voltage generation path and safe voltage clamp suitable for maintain a positive intermediate voltage.

A voltage generator 111 may generate the intermediate voltage in any convenient way. FIG. 2 illustrates the positive intermediate voltage path in more detail. FIG. 2 illustrates that the voltage generator 111P, in this example, comprises a current source 201 for generating a defined current through a defined resistance 202 to generate a voltage, which is buffered by buffer 203 to provide the positive intermediate voltage $V_{SAFEP}$.

The positive and negative intermediate voltages $V_{SAFEP}$ and $V_{SAFEN}$ may thus be selectively used to provide a gate control voltage for controlling a gate voltage of a transistor of the audio driving circuitry 100 in the high-voltage mode. As discussed above, if the source of a relevant transistor were held at one of the supply voltages, the relevant transistors could be controlled to be on or off by selectively controlling the gate voltage to be equal to the intermediate voltage or the supply voltage respectively. Referring back to FIG. 1, the intermediate voltages $V_{SAFEP}$ and $V_{SAFEN}$ are thus each supplied to at least one respective voltage selector 112P or 112N. The voltage selectors 112P and 112N are each operable to selectively output either the relevant intermediate voltage, or some other voltage, in this example the relevant supply voltage to provide suitable gate control voltages.

In the example of FIG. 1, the voltage selector 112P receives the positive intermediate voltage $V_{SAFEP}$ and the positive supply voltage $V_{POS}$ and outputs at least one control voltage $V_{TP}$ that may selectively vary between a voltage substantially equal to $V_{POS}$ or a voltage substantially equal to $V_{SAFEP}$. Such control voltage(s), as noted above, would be suitable, for example, for controlling a PMOS transistor with a source voltage at or near the positive supply $V_{POS}$ in both its on and off states.

Likewise a voltage selector 112N receives the negative intermediate voltage $V_{SAFEN}$ and the negative supply voltage $V_{NEG}$ and selectively outputs one of these voltages as at least control voltage $V_{TN}$, which would be suitable for controlling an NMOS transistor with a source voltage at or near the negative supply $V_{NEG}$ in both its on and off states.

The voltage selectors 112P and 112N may be controlled by respective transistor control signals $S_{TP}$ and $S_{TN}$, which may, for example, be logic signals that are generated to indicate the required state of transistor, i.e. off or on. In the example of FIG. 1, the voltage selector is, in effective, a level-shifter that levels shifts the input transistor control signal, which may for instance be a logic signal that varies between ground and a low positive voltage to signal logic 0 and logic 1, to a suitable gate voltage control that varies between the intermediate voltage and the supply voltage.

Figure 3:
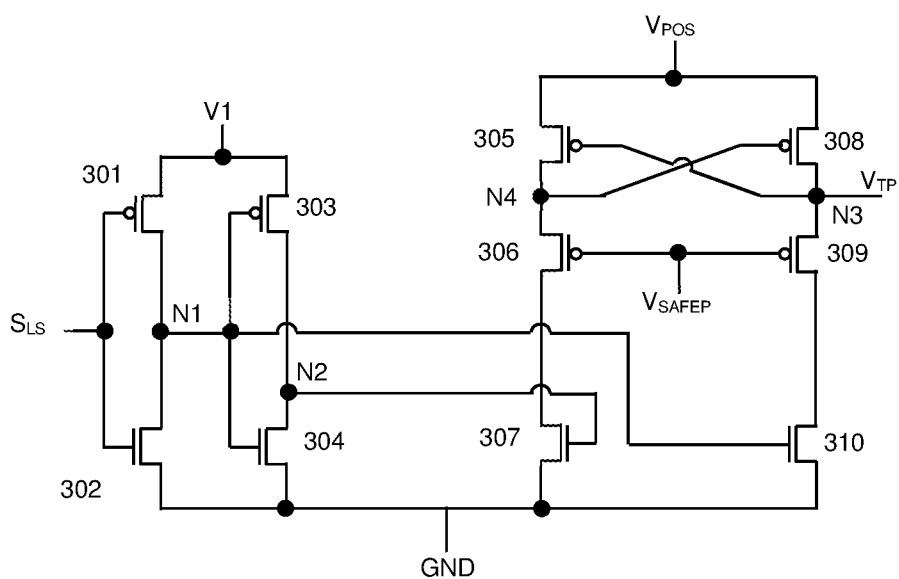
FIG. 3 illustrates one example of selective level-shifting circuit suitable for positive voltages.

FIG. 3 illustrates one example of a suitable level-shifting voltage selector, which could be used as the positive voltage selector 112P. The voltage selector has an input stage comprising four transistors 301-304 connected between a voltage V1 and the reference voltage, in this example ground. The voltage V1 may be a positive voltage which is lower than the supply voltage $V_{POS}$ in the high-voltage mode of operation and could for instance be the power supply voltage $V_{PS}$ which is input to the power supply module. This enables the input stage to be a low power stage, even when the audio driving circuit is operating in a high voltage mode. The input signal $S_{LS}$ may be a suitable logic signal, which, for voltage selector 112P, may be the logic signal $S_{TP}$. This input signal is coupled to the gates of series connected PMOS 301 and NMOS 302 transistor switches and thus selectively turns-on one of these switches to drive node N1 (between PMOS 301 and NMOS 302) to either V1 or ground. Thus, transistors 301 and 302 are connected as, and operate as, an inverter. The gates of series connected PMOS 303 and NMOS 304 are driven by the voltage at node N1 so that the voltage at midpoint node N2 is the other of either V1 or ground. Thus, transistors 303 and 304 are also connected as, and operate as, an inverter. The complementary voltages at nodes N1 and N2 control the output stage of the level-shifting voltage selector comprising transistors 305-310.

PMOS 305, PMOS 306 and NMOS 307 are connected in series in one limb between the positive supply voltage $V_{POS}$ and the reference voltage, in this example ground. Likewise, PMOS 308, PMOS 309 and NMOS 310 are connected in series between these voltages in another limb. PMOS 305 has its source coupled to the positive supply voltage $V_{POS}$ and its gate is driven by the voltage at node N3 between PMOS 308 and PMOS 309. Likewise PMOS 308 has its source coupled to the positive supply voltage $V_{POS}$ and its gate driven by the voltage at node N4. PMOS 306 and PMOS 309 have their gates coupled to the positive intermediate voltage, and their sources coupled to nodes N4 and N3 respectively. The complementary voltages at nodes N1 and N2 drive the gates of NMOS 310 and NMOS 307 so as to control conduction through one limb or the other. The interaction between the PMOS devices 305, 306, 308 and 309 of the output stage of the level-shifting voltage selector regulates the voltages at the nodes N3 and N4 to be near the supply voltage $V_{POS}$ and the positive intermediate voltage respectively, or vice versa, depending on which NMOS is on, and hence the state of the input signal $S_{TP}$. The control voltage $V_{TP}$ can be tapped from node N3, or equivalently node N4, or complementary outputs could be tapped from both nodes.

The source terminals of PMOS 305 and PMOS 308 of the output stage are coupled to the positive supply voltage. However, as the nodes N3 and N4 are regulated to not drop below the positive intermediate voltage $V_{SAFEP}$, the gate-source voltage of these transistors is maintained within tolerance. Likewise, the sources of PMOS 306 and 309, coupled to nodes N4 and N3 respectively may rise to be at or near the positive supply voltage $V_{POS}$ but the gates of these devices are maintained at the intermediate voltage $V_{SAFEP}$ and thus are kept within the gate-source voltage tolerance.

Figure 4:
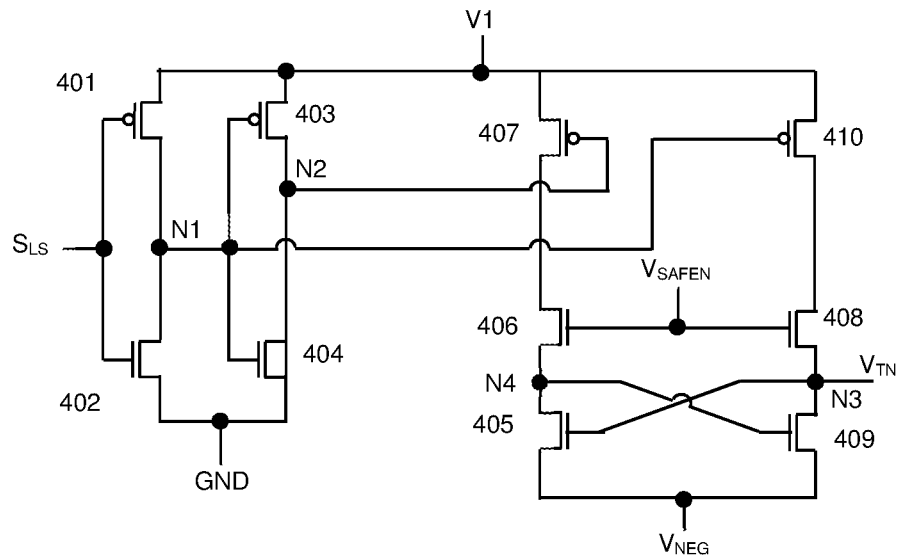
FIG. 4 illustrates one example of selective level-shifting circuit suitable for negative voltages.

FIG. 4 illustrates an example of a suitable level-shifting voltage selector which could be used as the negative selector 112N. Again, this has a low-voltage input stage with transistors 401-404 and a higher voltage output stage with transistors 405-410. The level-shifting selector operates in generally the same way, but in this case the input inverting stages control PMOS devices 407 and 410 to control conduction through the limbs of the output stage, and NMOS devices 405-408 operate to regulate the output voltage $V_{TN}$.

Referring back to FIG. 1, the generation of the intermediate voltages $V_{SAFEP}$ and $V_{SAFEN}$ thus advantageously allows the audio driving circuit 100 to operate in a high-voltage mode, with supply voltages having magnitudes greater than the maximum tolerable gate-source voltage of one or more transistors that may, in use, be coupled to receive the supply voltage at one terminal.

In some implementations the audio driving circuit may be operable in more than one voltage mode, i.e. with the power supply module 106 operable to output supply voltages of different magnitudes in the different voltage modes. This may advantageously allow use of a high voltage mode when required, e.g. for performance reasons to drive signals into a high impedance load, but allows use of a lower voltage mode, with a lower power consumption, when such a high-voltage mode is not required. The power supply module 106 may thus be operable in at least one low voltage mode of operation to generate power supplies where the magnitude of the supply voltages are lower than the gate-source tolerance of the transistors. In a low voltage mode of operation the maximum peak-to-peak signal swing may also be lower than the gate-source tolerance.

When operating in a low voltage mode, there may be no need to generate the intermediate voltage(s). Thus, when operating in a low voltage mode, the voltage generators 111 may be disabled, for instance the buffer 203 illustrated in FIG. 2 may be disabled. In this case the positive and negative supply voltages $V_{POS}$ and $V_{NEG}$ can be used as the control voltages without an undue voltage stress on the transistors. Switches 113P and 113N may thus be closed to connect the safe voltage inputs to selectors 112P and 112N to the negative and positive supply voltages $V_{NEG}$ and $V_{POS}$ respectively.

Whilst operation in multiple voltage modes, including at least one high voltage mode and at least one low voltage mode, may be beneficial in some applications, in other implementations the audio driving circuit may only be operable to generate a driving signal in one or more high-voltage modes, i.e. when the audio driving circuit is operational to receive the input signal $S_{IN}$ and generate the driving signal $S_D$, it always operates in a high-voltage mode. Even for an audio driving circuit which is only operable in a high-voltage mode, a switch such as switch 113P or 113N for connecting the safe voltage path to a defined system voltage may be beneficial for regulating the voltage of the path during start-up of the audio driving circuit.

In general therefore, embodiments relate to audio driving circuits that comprises at least one voltage generator 111 that, in a high-voltage mode of operation of the audio driving circuit, generates a suitable safe voltage for regulating the gate-source voltage of one or more transistors of the audio driving circuit which may be exposed to voltages of magnitudes greater than their gate-source voltage tolerance. This protects the relevant transistors from undue voltage stress during normal operation.

A problem can arise, however, on a hardware reset of the audio driving circuit. As one skilled in the art will appreciate, it is typical for audio driving circuitry to be implemented as integrated circuit and to include some reset functionality. The audio driving circuit may be controlled so as to respond to a reset condition, which may be received generally at any time, and to shut-down. In which case, the power supply module 106 will cease operating.

If the reset condition were to occur at a time that the audio driving circuit is operating in a high-voltage mode, the supply voltages at that time will be relatively high, for instance with a magnitude of the order of 5.5V or so. As discussed above, the power supply module will typically comprise a DC-DC converter such as a charge pump, and such a DC-DC converter will typically be configured to operate with output reservoir capacitors (not illustrated) to maintain the supply voltages in normal operation. In response to a reset condition the DC-DC converter may cease charging of these output reservoir capacitors, but it will take some time for these reservoir capacitors to discharge. In some implementations a respective discharge resistor may be selectively connected in series between the two terminals of the respective reservoir capacitors in a power-down or reset situation, so as to aid in discharging, but even in such implementations it may take several milliseconds for the reservoir capacitors to discharge to a level that is safe with respect to the gate-source voltage tolerance of the transistors.

In some instances the audio driving circuit may be operable to perform what may be called a software reset. In this case, digital control circuitry of the audio driving circuit may continue to receive externally generated system clocks during the shut-down process and the audio driver circuit can be powered-down in a controlled way. In such a software reset, the voltage generators 111 could be controlled so as to continue generating the safe intermediate voltages $V_{SAFEP}$ and $V_{SAFEN}$ until the reservoir capacitors of the power supply module have discharged to safe levels.

However, the audio circuitry may also be operable to perform what may be called a hardware reset, and in a hardware reset, the system clocks necessary for the digital control circuitry will typically become unavailable. In such a case the audio driver circuit loses the availability to power-down in a fully controlled way, and, in particular, control over the safe intermediate voltage may be lost. If the safe intermediate voltage were no longer available, or were to droop significantly, whilst the supply voltage magnitudes were still high, this could lead to damage of at least some transistors.

For example, as discussed with reference to FIG. 3, the positive intermediate voltage is used to control the gate voltages of transistors 306 and 309, as the voltage at one of nodes N3 and N4 may be substantially equal to the positive supply voltage $V_{POS}$. If, say, node N3 were at $V_{POS}$ at the time of a hardware reset, and generation of the positive intermediate voltage were to cease, so that the gate voltage of transistor were to drop, the gate-source voltage stress across transistor 309 may relatively quickly exceed the voltage tolerance.

In some instances this may be exacerbated by the fact that as the intermediate voltage level drops in the event of a reset, the switch 113P may attempt to turn on, which would then drive the intermediate voltage path to the negative supply voltage $V_{NEG}$. This could result in a voltage stress equal to the difference between the supply voltages being applied as a gate source voltage for transistor 309. For supply voltages of the order of ±5V or so, and a gate-source tolerance of the order of 3.5V, such a voltage stress would likely destroy transistor 309.

The audio driver circuit 100 thus includes at least one safe voltage clamp 114 for selectively clamping the intermediate voltage path to a safe voltage level in response to a reset condition, in particular in response to a hardware reset. FIG. 1 illustrates that there are safe voltage clamps 114P and 114N for the positive and negative intermediate voltage paths respectively (which may be referred to collectively or individually by the reference 114). The safe voltage clamp 114 is disabled in normal operation, but is enabled by clamp enable circuitry 115 in response to the reset condition, for instance a signal being received via a reset pin or the like.

Referring back to FIG. 2, this illustrates the safe voltage clamp and enable circuitry in more detail, in this case for the positive intermediate voltage path. As noted previously, if the audio driving circuit is operational and operating in a high voltage mode, the voltage generator 111P will be enabled to generate the desired positive intermediate voltage $V_{SAFEP}$ and switch 113P will be off. This positive intermediate voltage $V_{SAFEP}$ can be supplied to an input of selector 112P as discussed above.

In such a normal operating state the clamp enable circuitry 115 maintains the safe voltage clamp 114P in a disabled state.

The clamp enable circuitry 115 comprises a reset module (POR) 204 for monitoring for a reset condition, which may, for instance, be the receipt of a reset signal RST indicating that a reset is required. The reset signal RST may be an indication that specifically a hardware reset is required and the reset signal RST may be derived from the status of a monitored pin or terminal of the audio driving circuit. The POR module 204 generates an appropriate control signal $S_{RST}$ to enable or disable the safe voltage clamp 114P.

The safe voltage clamp 114P, in this example, comprises a series of diodes connected between the positive supply voltage $V_{POS}$ and the intermediate voltage path, with a clamp enable transistor 205 in series. In the disabled state, the clamp enable transistor 205, in this case a PMOS, is controlled to be off. To enable the safe voltage clamp 114, the clamp enable switch 205 is turned on. The positive supply voltage $V_{POS}$ forward biases the diodes of the clamp, but the voltage drop across the diodes means that the voltage at the intermediate voltage path is lower in magnitude than the supply voltage $V_{POS}$. The safe voltage clamp 205 is arranged to provide a selected voltage drop so that the voltage developed by the clamp when enabled can be used as the safe intermediate voltage. The safe voltage clamp 205 thus selectively, when enabled, provides voltage clamping the intermediate voltage path to a safe voltage level so as to maintain the magnitude of the gate-source voltage of the first transistor below said tolerance.

The safe voltage clamp 114P, when enabled, thus operates to clamp the voltage of the intermediate voltage path to a voltage having a defined relationship to the positive supply voltage, at least until the positive supply voltage $V_{POS}$ drops to a sufficiently low level. The safe voltage clamp can be seen as an alternative voltage generator that may be enabled when the voltage generator 111P is not available. Conveniently the voltage provided by the voltage clamp, if enabled from the high-voltage mode of operation, will, at least initially, be substantially similar to that provided by the voltage generator 111P when operational.

When the clamp 114P is disabled, the source of clamp enable switch 205 may be at or near the positive supply voltage $V_{POS}$. The clamp control switch 205 may be maintained in the off-state by a gate control voltage equal to $V_{POS}$. In this case there is no significant gate-source voltage stress. To turn the clamp enable switch 205 on, the gate voltage may be controlled to the intermediate voltage level (which will be available at the time that the reset signal is received, and once the safe voltage clamp 114P is enabled, will be maintained by the operation of the safe voltage clamp 114P itself).

To generate these control voltages the reset control signal $S_{RST}$ may be input to a selective level-shifter, i.e. a level-shifting voltage selector 206. In some examples the selective level-shifter 206 may comprise a level-shifting voltage selector such as illustrated in FIG. 3 and discussed above. In this instance however the input $S_{LS}$ to the level shifter would be the reset control signal $S_{RST}$. In addition, to ensure that the selective level-shifter 206 operates correctly during the reset process, the low power input stage may be powered from an always available power domain, e.g. for a battery powered device, the input stage of the level-shifter 206 may be powered from the battery domain. In the example illustrated in FIG. 2 the clamp enable circuitry includes a voltage regulator, such as a low-drop-out (LDO) regulator or the like that receives a battery voltage $V_{BD}$ and which provides a regulated battery voltage $V_{BR}$ that can be used to power the level-shifter 206, e.g. as V1 in FIG. 3. The regulated battery voltage $V_{BR}$ may also be used to power other components of the clamp enable circuitry, such as the POR module 204 so as to ensure these components are functional as long the battery voltage is available.

Figure 5:
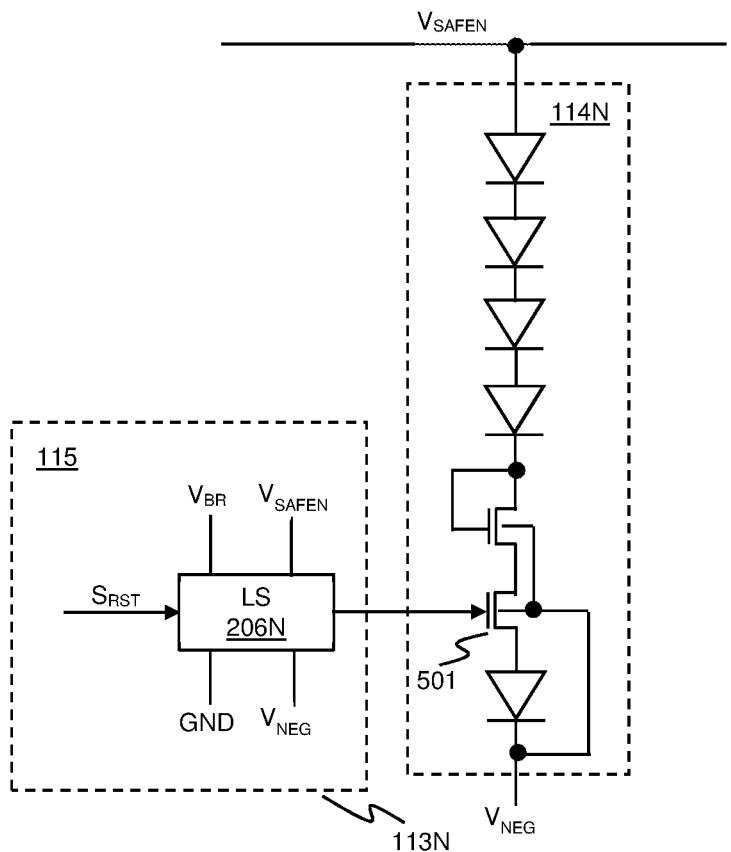
FIG. 5 illustrates an example of safe voltage clamp suitable for maintaining a negative intermediate voltage.

The safe voltage clamp 114N may operate in a similar way. FIG. 5 illustrates an example of the safe voltage clamp 114N, which includes enable switch 501, in this example an NMOS. To drive the enable switch 501, a selective level shifter 206N may be used, which may for example have the structure as shown in FIG. 4. The input $S_{LS}$ to the selective level-shifter 206N may be the logic signal $S_{RST}$ output from the POR module 204 discussed earlier in relation to FIG. 2.

The safe voltage clamp(s) 114 thus ensure that an intermediate voltage, generated so as to control the gate voltages of one or more transistors of the audio driving circuit in a high-voltage mode of operation, remains available if the audio driving circuit undergoes a reset process. The safe voltage clamp(s) enable a safe transition from an operating state, in a high-voltage mode, to a reset state and ultimately power down. The clamp enable circuitry is operated as part of an always available power domain and in particular the clamp enable circuitry may be powered from a received battery voltage, so that this circuitry can operate correctly during the reset.

As described above the positive and negative intermediate voltages $V_{SAFEP}$ and $V_{SAFEN}$ are used, in some embodiments, to control the gate voltage of transistors of the selectors 112P and 112N. The control voltages $V_{TP}$ and $V_{TN}$ output from the selectors 112P and 112N may be used to control operation of various other transistors of the audio driving circuit and to maintain the gates-source voltage within tolerance.

In some implementations the transistors controlled by the output of the selectors 112P and 112N may comprise part of the output driver 105, e.g. the amplifier.

Figure 6:
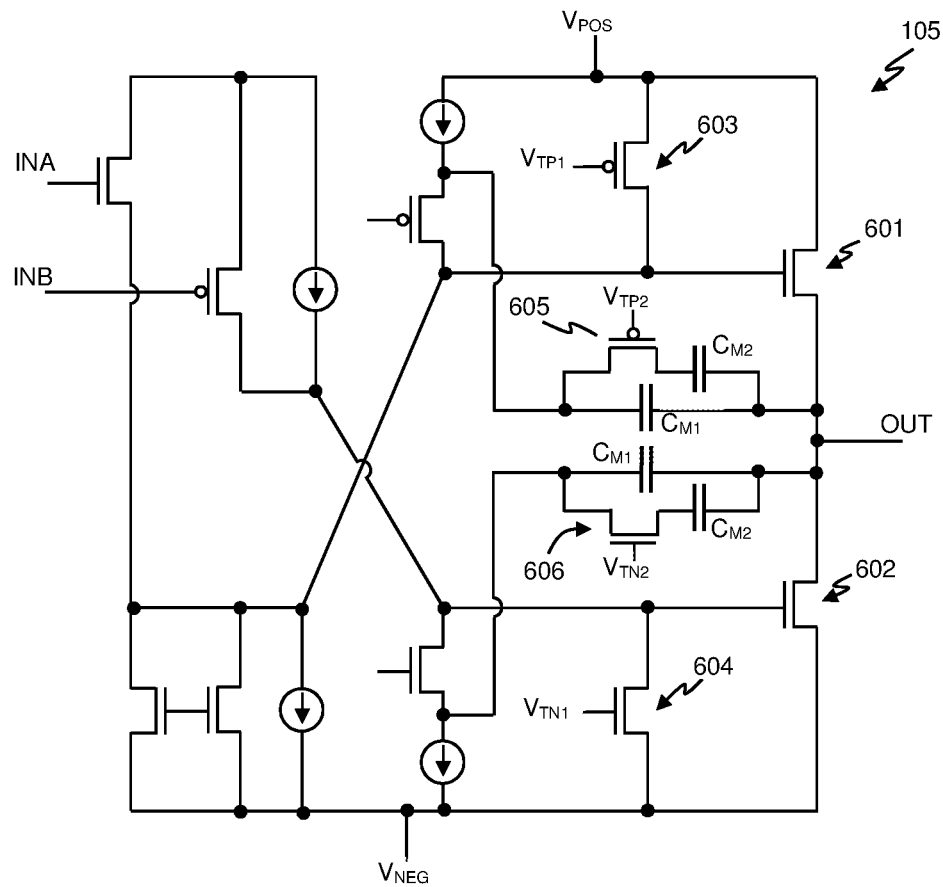
FIG. 6 illustrates one example of part of a suitable audio output driver.

For example, FIG. 6 illustrates part of one example of an amplifier arrangement suitable for output driver 105. FIG. 6 illustrates at least part of an output stage of an amplifier, that may, for example, be configured as a transconductance with capacitance feedback compensation (TCFC) amplifier, as would be understood by one skilled in the art. In some arrangements it is only the output stage of the amplifier that receives the high positive and negative voltages $V_{POS}$ and $V_{NEG}$ and experiences the full output signal range in a high-power mode of operation, and thus the voltages stress may be lower for preceding stages of the amplifier. FIG. 6 illustrates that output PMOS and NMOS transistors 601 and 602 are connected in series between the positive and negative voltage supplies $V_{POS}$ and $V_{NEG}$ and driven to generate the driving signal $S_D$ at the amplifier output OUT. Signal INA and INB are received from a preceding stage are received and, in operation, control the driving of the output transistors 601 and 602.

FIG. 6 also illustrates a transistor 603, in this example a PMOS, configured to control the gate voltage of the output PMOS 601 during power-down of the amplifier 105. In normal operation, the transistor 603 is off, so that the output PMOS 601 is appropriately driven by the input signal to provide the driving signal $S_D$. During power-down of the amplifier 105, it may be desirable to ensure that the output PMOS 601 is turned-off, and thus transistor 603 may be turned-on to connect the gate terminal of the output PMOS 601 to $V_{POS}$. Transistor 603 is configured with its source node coupled to the positive supply voltage $V_{POS}$ and its drain connected to the gate control for the output PMOS 601. Transistor 603 may be implemented as a transistor with an enhanced drain tolerance, e.g. as an LDMOS or EDMOS such as discussed previously, to withstand the source-drain voltage stress in its off-state. The source of transistor 603 is, in this example, coupled to the voltage $V_{POS}$ and thus the gate can be controlled by a control signal $V_{TP1}$ output by a suitable selector 112P to selectively vary between the positive supply voltage $V_{POS}$ or the positive intermediate voltage $V_{SAFEP}$.

Likewise a transistor 604, in this example an NMOS, is coupled between the negative supply voltage $V_{NEG}$ and the gate control for output NMOS 602 so as to control the gate voltage of the output NMOS 602 during power down. The source of transistor 604 is coupled to the negative supply voltage $V_{NEG}$ and can be controlled by a control signal $V_{TN1}$ output by a suitable selector 112N to selectively vary between the negative supply voltage $V_{NEG}$ or the negative intermediate voltage $V_{SAFEN}$.

Note that FIG. 6 illustrates that transistors 603 and 604 are configures with their sources connected to the respective supply voltage. This arrangement may be used when the respective supply voltages are the greatest positive and negative system voltages, which may likely be the case when operating in a high-voltage mode of operation. However, if the audio driver circuit were operable in a mode where one of the supply voltages was lower in magnitude than one of the other system voltages, it may be preferable to connect the source of the transistor 603 or 604 to such other system voltage as appropriate. For instance if the audio driver circuit is also operable in a low-voltage mode, where the positive supply voltage is lower than the power supply input voltage $V_{PS}$, it may be preferable for the source of transistor 603 to be coupled to that voltage $V_{PS}$, and the source of transistor 603 could thus be coupled to different supplies in different modes of operation. In some embodiments however the negative supply $V_{NEG}$ may the greatest magnitude negative supply in all modes of operation, so the source of transistor 604 may just be coupled to negative supply voltage.

FIG. 6 also illustrates that there are capacitances $C_{M1}$ in a feedback paths providing feedback around the output stage. Such capacitors act as Miller capacitances. It will be noted that in a practical amplifier there may additionally be feedback from the output to one of the preceding stages (not illustrated in the FIG. 6).

It may be desirable to be able to vary the value of the Miller capacitance in the output stage feedback path. FIG. 6 thus shows additional capacitors $C_{M2}$ that can be selectively connected in parallel with capacitor $C_{M1}$ to vary the effective Miller capacitances by controlling transistor switches 605 and 606. Again, the transistors 605 and 606 may be subjected to relatively high drain-source voltages in a high-voltage mode of operation and thus may be implemented as LDMOS or EDMOS type devices. The gate of PMOS transistor 605 may be controlled by a controlled signal $V_{TP2}$ output from a selector 112P and the gate of NMOS transistor 606 may be controlled by a controlled signal $V_{TN2}$ output from a selector 112N.

It should be understood that the control voltage $V_{TP1}$, for controlling transistor 603 (to be on during amplifier power-down) should vary independently from the control voltage $V_{TP2}$ which selectively controls transistor 605 to add the effect of additional Miller capacitance $C_{M2}$ during operation if required. That is although signals $V_{TP1}$ and $V_{TP2}$ may vary between the same voltage levels, e.g. $V_{POS}$ and $V_{SAFEP}$, the timing of switching between these levels will generally be independent, and thus each control signal may thus be selectively output by an individual selector 112P (not separately illustrated).

In some implementations a transistor controlled by the output of at least one of selectors 112P and 112N may comprise part of some other component of the audio driver circuitry that may be subject to high-voltage stress in the high-voltage mode of operation, for instance a transistor of the output path clamp 110.

Figure 7:
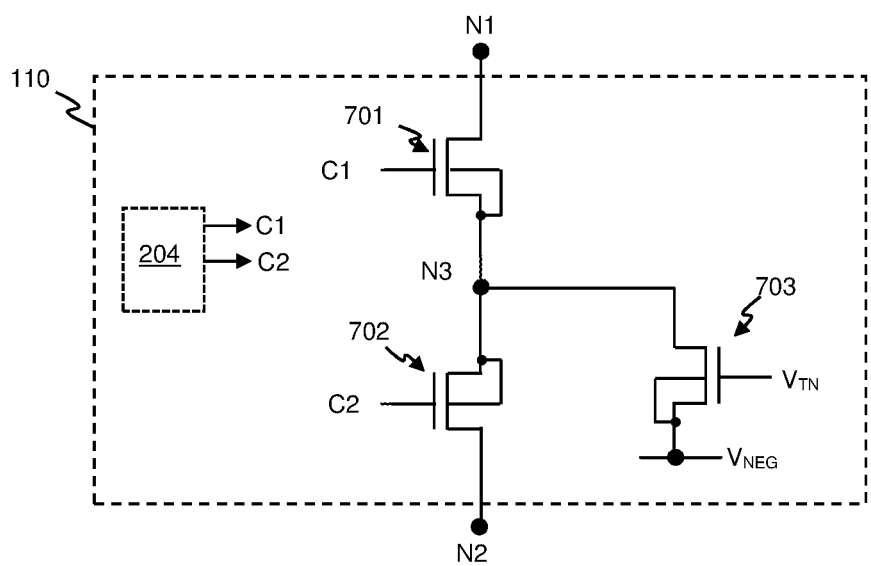
FIG. 7 illustrates one example a suitable output path clamp switch arrangement.

FIG. 7 illustrates one example of a switch arrangement for the output path clamp switch. FIG. 7 illustrates that two transistors 701 and 702 of the same polarity-type, in this example NMOS devices, are coupled in in series between nodes N1 and N2 of the clamp, with the source of each transistor coupled together at node N3. Node N1 may be coupled to the output path and node N2 may be coupled to the reference voltage, e.g. ground. When the output path clamp is disabled, transistors 701 and 702 will be in the off-state. To keep these transistors off, even for the peak negative value of the driving signal that may be expected at node N1 in use, the gate control voltages C1 and C2 for transistors 701 and 702 may be equal to $V_{NEG}$ in the off state. To prevent the voltage at node N3 from varying to a level that would lead to an unacceptable gate-source voltage, the voltage N3 is regulated in the clamp disabled state, by transistor 703. Transistor 703 is a transistor of the same polarity type, in this example an NMOS, with its source coupled to the negative supply voltage $V_{NEG}$ and its drain coupled to node N3. Transistor 703 can thus be controlled by a control voltage $V_{TN}$ as may be generated by selector 112N as discussed above and may be at a voltage equal to $V_{SAFEN}$ when transistor 703 is on. In this stage, the voltage at node N3 is held at $V_{NEG}$. The source-drain voltage across transistor 701 may thus vary with driving signal to be effectively equal to the peak-to-peak voltage stress, but this is within the tolerance of an LDMOS or EDMOS as discussed above. The source-drain voltage across transistor 702 is equal to the magnitude of the negative supply voltage $V_{NEG}$, which again can be within the tolerance of a suitable LDMOS or EDMOS. In this stage there is substantially no gate-source voltage stress across transistors 701 and 702.

When the output path clamp is enabled, both transistors 701 and 702 are in the on-state and transistor 703 is turned-off. Transistor 703 can be turned-off by the control voltage $V_{TN}$ being selected to be $V_{NEG}$. In this state no driving signal is being output to the output path and thus node N1 will be held at or near the same voltage as the reference voltage at node N2, i.e. both nodes may be at or near ground, as will be node N3. The drain-source voltage across transistor 703 is thus equal to the negative supply voltage $V_{NEG}$. In this state the control voltages for transistors 701 and 702 may be controlled to be a positive voltage sufficient to turn-on these transistors but within the gate-source tolerance, for instance the gate voltage for transistors 701 and 702 could be equal to the voltage $V_{PS}$ when these transistors are on.

It will be noted that FIGS. 6 and 7 illustrates just some examples of transistors that may be controlled using the safe intermediate voltage levels generated by the voltage generator(s) 111.

Whilst the discussion above has focussed on generating an intermediate safe voltage that can be used as a gate control voltage for a transistor in a high-voltage mode of operation of the audio driving circuit, it may additionally or alternatively be advantageous to generate intermediate safe voltages so as to regulate the voltage at other circuit nodes, for instance at some other terminal of a semiconductor device, so as to avoid voltage stress across the semiconductor device greater than the relevant voltage tolerance of the device. The principles of the present disclosure would apply to such other protected nodes, and the present disclosure relates to the use of a safe voltage clamp, which is enabled on a reset condition, for any voltage path where an intermediate voltage, different to a supply voltage, is generated and absence of the intermediate voltage could lead to unwanted voltage stress across a component.

In general, embodiments of the present disclosure thus relate to methods and apparatus for voltage control and in particular to voltage control for audio driving circuitry. Some embodiments relate to audio driving circuits which are operable in a high-voltage mode of operation in which at least one supply voltage may be sufficiently high such that, in use, at least one semiconductor device may be subjected to a voltage at one terminal which is above a voltage tolerance for the device, for instance a source voltage of a transistor may exceed a gate-source voltage tolerance. The audio circuitry may also include at least one voltage generator operable, when the power supply is operating in the high-voltage mode of operation, to generate an intermediate voltage with a magnitude which is smaller than the magnitude of the supply voltage and which is selectively applied to a terminal of the semiconductor device so as to maintain a voltage stress across the first semiconductor device within said tolerance. For example an intermediate voltage may be selectively applied as a control voltage for the gate terminal of a transistor.

Some embodiments relate, in general, to integrated circuit having a voltage generator for generating a first controlled voltage for use as safe gate control voltage for at least one transistor and a voltage clamp for clamping the output of the voltage controller, wherein the voltage clamp is enabled and disabled by a reset signal for the integrated circuit It should be noted that any example voltages described above are given purely as examples for ease of explanation. Other voltages may be applicable for other applications and for different semiconductor fabrication processes. For example, as discussed above one known process may provide a gate oxide with a voltage tolerance of the order of 3V or so. Other processes, e.g. smaller process node geometries, may typically result in a different, e.g. lower, voltage tolerance. The principles of the present disclosure could be implemented to provide audio circuitry that can cope with larger signals swings whilst keeping the gate-source voltage within tolerance.

The embodiments have been described with reference to audio driving circuitry but the principles of generating safe voltage levels and clamping the safe voltage levels in the event of a reset may be applicable to other applications.

Note that as used herein the term audio is not restricted to frequencies within the audible frequency range and the term audio should be read as including other frequencies such as ultrasonic frequencies and/or driving signals such as haptic driving signals for haptic transducers such as linear resonant actuators or the like.

Embodiments may be implemented as an integrated circuit which in some examples could be a codec or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a wearable device such as a smartwatch. The device could be a device with voice control or activation functionality.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:
1. An audio driving circuit comprising:
a first transistor having a gate-source voltage tolerance;
a power supply module configured to generate at least a first supply voltage for the audio driving circuit, wherein the audio driving circuit is operable in a first mode in which the first supply voltage has a first magnitude such that, in use, a voltage magnitude at a source terminal of the first transistor can exceed the gate-source voltage tolerance of the first transistor;
a voltage generator configured to, in the first mode, output a first intermediate voltage to an intermediate voltage path for use as a gate control voltage for at least the first transistor, the first intermediate voltage having a magnitude lower than said first magnitude so as to maintain the magnitude of the gate-source voltage of the first transistor below said tolerance when applied to the gate of the first transistor; and
an intermediate path voltage clamp for selectively voltage clamping the intermediate voltage path to a voltage level so as to maintain the magnitude of the gate-source voltage of the first transistor below said tolerance, wherein said voltage clamp is enabled by a reset condition for the audio driving circuit.

2. An audio driving circuit as claimed in claim 1 wherein said reset condition comprises initiation of a hardware reset during which one or more externally generated clocks for digital control of the audio driving circuit are not available.

3. An audio driving circuit as claimed in claim 1 comprising clamp enable circuitry configured to enable operation of the first intermediate path voltage clamp in response to said reset condition.

4. An audio driving circuit as claimed in claim 3 wherein the clamp enable circuitry is configured to receive a power supply which is different to the input voltage for the power supply module and which remains available during a reset initiated by said reset condition.

5. An audio driving circuit as claimed in claim 4 wherein the clamp enable circuitry is configured to receive a battery voltage from a battery of a host device as said power supply and wherein the clamp enable circuitry comprising a voltage regulator configured to regulate said battery voltage.

6. An audio driving circuit as claimed in claim 3 wherein the clamp enable circuitry comprises a reset module configured to monitor for the reset condition and, in response to detecting the reset condition, to generate a reset control signal to enable the intermediate path voltage clamp.

7. An audio driving circuit as claimed in claim 1 wherein the intermediate path voltage clamp comprises a series connection of a plurality of diodes and a clamp enable transistor configured in series between a node that receives the first supply voltage and a node of the intermediate voltage path.

8. An audio driving circuit as claimed in claim 7, wherein the clamp enable circuitry comprises a voltage selector configured to receive the reset control signal, the first supply voltage and the first intermediate voltage and, based on the reset control signal, to selectively output an output voltage based on either the first supply voltage or the first intermediate voltage as a gate control signal for the clamp enable transistor of the intermediate path voltage clamp.

9. An audio driving circuit as claimed in claim 1 comprising at least a first voltage selector configured to receive the first intermediate voltage and to selectively output the intermediate voltage as a gate control voltage for at least one transistor based on a received transistor control signal for the relevant transistor.

10. An audio driving circuit as claimed in claim 9, wherein the first voltage selector is configured to receive the transistor control signal, the first supply voltage and the first intermediate voltage and, based on the transistor control signal, to selectively output an output voltage based on either the first supply voltage or the first intermediate voltage as the gate control voltage.

11. An audio driving circuit as claimed in claim 10, wherein the first transistor forms part of the first voltage selector.

12. An audio driving circuit as claimed in claim 9, wherein said first voltage selector outputs a gate control voltage to at least one of: a transistor of an output stage of an output driver of the audio driving circuit; and a transistor of an audio output path clamp switch.

13. An audio driving circuit as claimed in claim 1 wherein the first transistor is one of a laterally diffused MOS transistor device or an extended drain MOS transistor device.

14. An audio driving circuit as claimed in claim 1 wherein the power supply module is operable, in the first mode, to further generate a second supply voltage of opposite polarity but equal magnitude to the first supply voltage.

15. An audio driving circuit as claimed in claim 14 further comprising:

a second voltage generator configured to, in the first mode, output a second intermediate voltage to a second intermediate voltage path for use as a gate control voltage for at least a second transistor, the second intermediate voltage having a magnitude lower than said first magnitude so as to maintain the magnitude of the gate-source voltage of the second transistor below a gate-source voltage tolerance of the second transistor when applied to the gate of the second transistor; and an intermediate path voltage clamp for selectively clamping the second intermediate voltage path to a defined voltage so as to maintain the magnitude of the gate-source voltage of the second transistor below said tolerance, wherein said voltage clamp is enabled by a reset condition for the audio driving circuit.

16. An audio driving circuit as claimed in claim 1 wherein the power supply module is further operable in a second mode in which the first supply voltage has a second magnitude, wherein the second magnitude is lower than the first magnitude and, in normal operation in the second mode, a voltage magnitude at a source terminal of the first transistor cannot exceed the gate-source voltage tolerance of the first transistor.

17. An audio driving circuit as claimed in claim 16 wherein the voltage generator is disabled in the second mode.

18. An electronic device comprising an audio driving circuit as claimed in claim 1 and a connector for making a removable mating connection with an accessory apparatus in use, wherein said audio driving circuit is configured to output at least one audio driving signal to an electrical contact of said connector.

\* \* \* \* \*